Sept. 6, 1966 R. G. WILLIAMSON 3,270,760

PNEUMATIC MULTIPLIER (VERY HIGH GAIN AMPLIFIER)

Filed Dec. 19, 1963 2 Sheets-Sheet 1

INVENTOR
ROBERT G. WILLIAMSON

BY Thomas P. Murphy
AGENT 3,270,760
Patented Sept. 6, 1966

3,270,760

PNEUMATIC MULTIPLIER (VERY HIGH GAIN AMPLIFIER)

Robert G. Williamson, Norwalk, Conn., assignor to Sperry Rand Corporation, New York, N.Y., a corporation of Delaware Filed Dec. 19, 1963, Ser. No. 331,819
7 Claims. (Cl. 137—81.5)

This invention relates to a pneumatic amplifier and more particularly to a high gain pneumatic amplifier.

Power gain of a pneumatic amplifier may be defined in one sense as the ratio of the output power available for loads to the input power required for switching.

In typical pneumatic amplifier devices this gain is very low. By size scaling the power level of a pneumatic amplifier may be increased or decreased but the gain remains substantially constant. The gain may be increased or decreased to a very limited extent by varying the surface contours of an amplifier. However, even under the most ideal conditions the increase in gain is very limited. The only practical way heretofore available for increasing gain is by cascading a series of pneumatic amplifiers together. Compared to a single unit device this arrangement of cascaded amplifiers has a much slower response time and requires considerably more space.

The present invention contemplates a unique construction wherein very high gain can be achieved in a single amplifier. The present invention contemplates a pneumatic amplifier having a very high gain which operates at a substantially higher speed and takes up considerably less space than a series of cascaded devices.

Therefore, it is an object of the present invention to provide a high gain pneumatic amplifier.

Another object of the present invention is to provide a high gain pneumatic amplifier which is much smaller in size and much faster in speed of operation than presently available pneumatic amplifiers of equivalent gain.

A further object of the present invention is to provide a pneumatic amplifier whose gain is a direct function of its physical dimensions.

A still further object of the present invention is to provide a pneumatic amplifier wherein any desired gain may be obtained.

Yet another object of the present invention is to provide high gain in a single fluid amplifier wherein the gain is a function of the distance between the control inlets and power outlets.

Other objects and many of the attendant advantages of the present invention will become apparent with the reading of the specification in conjunction with the drawing wherein.

Figure 1:
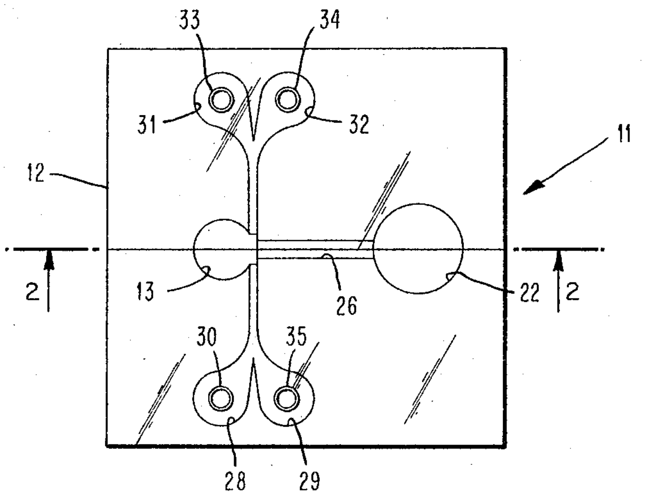
FIGURE 1 shows a top view of a preferred embodiment of the present invention.
Figure 2:
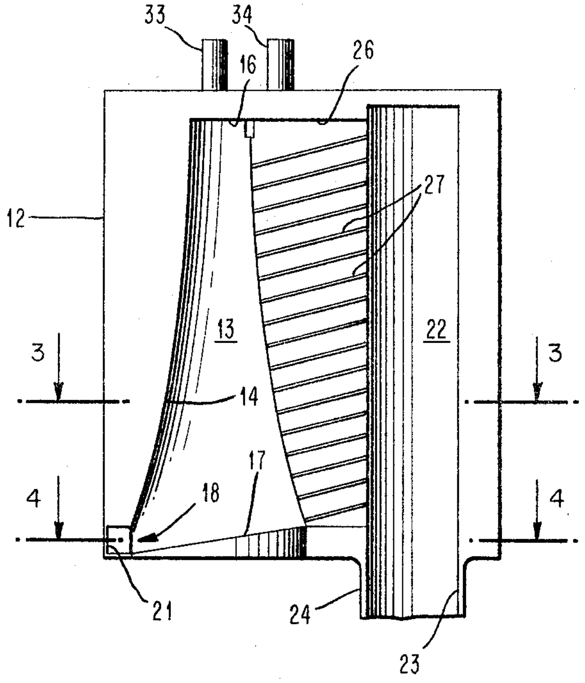
FIGURE 2 shows a side view taken through line 2—2 of FIGURE 1 in cross section of a preferred embodiment of the present invention.

Referring now more particularly to FIGURES 1 and 2, there is shown a pneumatic amplifier 11 comprising a housing 12 composed of any suitable material such as plastic. Housing 12 may consist of two symmetrical halves joined together in any suitable manner. Housing 12 has formed therein a vortex chamber 13 which has a circular cross section and which gradually increases in diameter from one end to the other. The contour of wall 14 of vortex chamber 13 may be straight, conical, spherical, exponential, or some other shape for obtaining any desired flow characteristic. Vortex chamber 13 is enclosed at its point of smallest diameter by portion 16 of housing 12. Sloped wall 17 encloses vortex chamber 13 at its point of greatest diameter and may be integral with housing 12.

Figure 4:
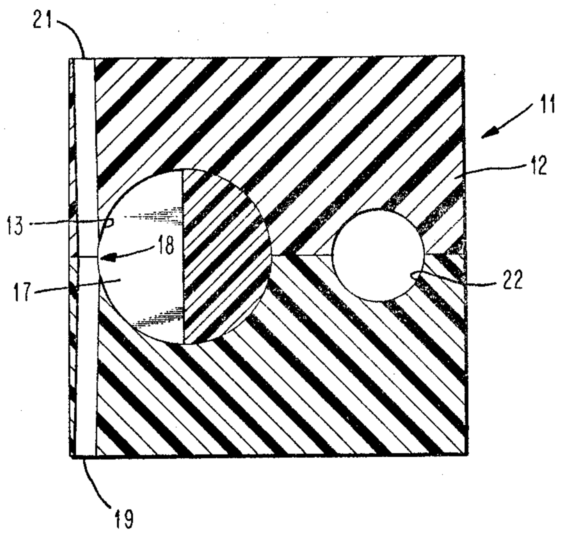
FIGURE 4 shows a cross sectional view of FIGURE 1 taken through line 4—4 of FIGURE 2.

As best seen in FIGURE 4, vortex chamber 13 has an opening 18 which communicates with outlet ports 19 and 21 formed in housing 12. Thus, depending on the direction of the vortex of fluid within chamber 13, the fluid is emitted from the chamber 13 at outlet port 19 or outlet port 21 as will be more fully explained hereinbelow.

Figure 3:
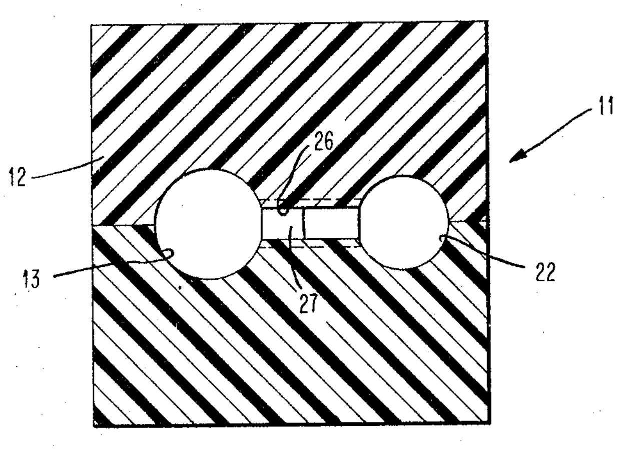
FIGURE 3 shows a cross sectional view taken through line 3—3 of FIGURE 2.

Housing 12 also has formed therein cylindrical chamber 22. The longitudinal axes of chambers 13 and 22 are in parallel relationship to each other. Chamber 22 is adapted by means of lip 23 to be connected to a power fluid supply (not shown) through opening 24. Chamber 22 communicates with vortex chamber 13 by means of a slot 26 formed in housing 12 which runs substantially the entire axial length of chambers 22 and 13. As best seen in FIGURES 1 and 3 slot 26 increases in width in the direction that chamber 13 increases in diameter. Slot 26 may contain deflectors 27 integral or otherwise fixed to the wall thereof and slanted downward for deflecting power fluid in a downward direction as it enters vortex chamber 13 from chamber 22. Sloped wall 17 and deflectors 27 are at substantially the same angle with respect to the horizontal angle.

As best seen in FIGURE 1 pneumatic amplifier 11 is provided with OR input channels 28 and 29 formed in one side of housing 12 and OR input channels 31 and 32 formed in the other side of housing 12 on opposite sides of slot 26. These OR input channels communicate with vortex chamber 13 at the point where the narrowest portion of slot 26 communicates with vortex chamber 13. Input conduits 30, 35, 33 and 34 communicate through housing 12 with OR input channels 28, 29, 31, and 32, respectively. The two conduits 33 and 34 which communicate with OR input channels 31 and 32 respectively are also visible in FIGURE 2.

In operation, power fluid is fed into chamber 22 via opening 24. The power fluid then enters vortex chamber 13 through slot 26. Since slot 26 increases in width in the direction that the diameter of vortex chamber 13 increases, increasing amounts of fluid are fed into vortex chamber 13 as its diameter increases. Thus, the amount of power fluid fed into vortex chamber 13 is small in the vicinity of wall portion 16 but gradually increases as the diameter of vortex chamber 13 increases toward bottom portion 17. Deflectors 27 within slot 26 cause the power fluid to enter vortex chamber 13 oriented in a downward direction.

Without a control fluid applied to input channels 28, 29, 31 or 32 power fluid within the vortex chamber 13 is in a defused state and leaves pneumatic amplifier 11 in equal amounts through the outlets 19 and 21. When, however, a control fluid signal is applied to input channel 31 or 32 through input conduits 33 or 34, respectively, the power fluid entering vortex chamber 13 near its smallest diameter portion is caused to form into a spiraling vortex. This vortex spirals in a downward direction, which in turn causes the power fluid entering the vortex chamber 13 at various points along the length thereof to also form into a vortex until all the power fluid entering the vortex chamber 13 is formed into a single downwardly spiraling vortex throughout the entire length of vortex chamber. Since the input control fluid is applied to input channels 31 or 32, the spiral is in the clockwise direction and therefore the power fluid leaves vortex chambers 13 via opening 18 and outlet 21. The ratio of output power available for loads at outlet 21 to the input power of the control fluid, i.e., the gain is a function of the axial distance of outlets 19 or 21 from end portion 16 where the control inputs are applied. Alternately, when the control input is applied to channels 28 or 29 via conduits 30 or 35, respectively, the vortex created within the vortex chamber 13 is in the counter clockwise direction and, therefore, leaves vortex chamber 13 via opening 18 and outlet 19. By virtue of the above arrangement it should be noted that only a very small power is necessary to switch a very large power. The gain of the pneumatic amplifier may be increased or decreased by increasing or decreasing the axial length of vortex chamber 13 between control inlets and power outlets. The gain obtainable by use of the present invention is limited only to the power available at the input.

Needless to say, other control input arrangements may be used with the present invention other than the OR input arrangement described.

The embodiments of the invention in which an exclusive property or privilege is claimed are defined as follows:

1. A tapered chamber, means for introducing fluid into said chamber in amounts gradually increasing from one end of said tapered chamber to the other, control means communicating with said chamber for initiating a vortex movement of said fluid at said one end of said chamber which in turn effects an increasing vortex movement of said fluid throughout said chamber.

2. In a pneumatic amplifier, a vortex chamber enclosed by a circular wall increasing in diameter in the axial direction, means for introducing power fluid into said chamber in increasing amounts along the axial direction, means for introducing a control fluid into said vortex chamber at its smallest diameter whereby a downwardly spiraling vortex is created out of said power fluid introduced at said smallest diameter which in turn creates a downwardly spiraling vortex out of said increasing amounts of power fluid introduced along said axial direction.

3. A pneumatic device, comprising in combination: a chamber enclosed by a circular wall increasing in diameter in the axial direction, means for introducing power fluid into said chamber in increasing amounts along the axial direction, control inlet means disposed in said wall at the smallest diameter of said chamber for providing a control fluid to cause said power fluid to form into a spiraling vortex within said chamber, outlet means disposed in said wall and displaced from said control inlet means a predetermined distance whereby the difference in power between said control fluid and said power fluid varies as said predetermined distance.

4. A pneumatic device, comprising in combination: a vortex chamber enclosed by a circular wall increasing in diameter in the axial direction, said circular wall having an elongated slot formed therein and extending substantially the entire axial length thereof, said slot increasing in width as said circular wall increases in diameter, power inlet means communicating with said vortex chamber through said slot for supplying fluid into said vortex chamber, control inlet means formed in said wall at its smallest diameter, outlet port means formed in said wall near its largest diameter.

5. A pneumatic device, comprising in combination: a vortex chamber enclosed by a circular wall increasing in diameter in the axial direction, said circular wall having an elongated slot formed therein and extending substantially the entire axial length thereof, said slot increasing in width as said circular wall increases in diameter, power inlet means communicating with said vortex chamber through said slot for introducing power fluid into said vortex chamber in increasing amounts along the axial direction, control inlet means formed in said wall at the smallest diameter of said vortex chamber for introducing a control fluid therein creating a downwardly spiraling vortex out of the power fluid introduced at said smallest diameter which in turn creates a downwardly spiraling vortex out of said increasing amounts of power fluid introduced along said axial length, outlet means disposed in said wall and displaced from said control inlet means a predetermined distance whereby the difference in power between said control fluid and said power fluid varies as said predetermined distance.

6. In a pneumatic amplifier: an elongated chamber having a circular cross section of increasing diameter and having a slot in substantially the entire length of the wall thereof which increases in width in the direction of increasing diameter, fluid inlet means communicating with said chamber through said slot for supplying fluid to said chamber at a predetermined pressure, first and second control ports communicating with said chamber where said chamber has its smallest diameter and said slot has its smallest width, first and second outlet ports in the wall of said chamber near its point of greatest diameter, means providing a control fluid to said first or second control ports to create a spiraling vortex of said fluid within said chamber expelling said fluid from said chamber through said first or second outlet port whereby the gain of said fluid amplifier is a function of the distance said outlet ports are positioned along the length of said chamber.

7. A pneumatic amplifier, comprising in combination: a housing having formed therein; a first chamber of circular cross section increasing in diameter along the axial length thereof, a second chamber of circular cross section in axial parallel relationship with said first chamber and opened at one end, a slot increasing in width as said first chamber increases in diameter interconnecting said first chamber to said second chamber, a plurality of deflectors disposed within said slot in parallel, spaced relationship slanted in a downward direction relative to said second chamber, at least one control fluid inlet disposed on each side of said slot communicating with said first chamber at its smallest diameter, outlet means communicating with said first chamber near its largest diameter.

References Cited by the Examiner

UNITED STATES PATENTS

| | | | |
|---|---|---|---|
| 2,998,137 | 8/1961 | Vane | 209—211 |
| 3,182,675 | 5/1965 | Zilberfarb et al. | 137—81.5 |
| 3,208,462 | 9/1965 | Fox et al. | 137—81.5 |

M. CARY NELSON, *Primary Examiner.*

W. CLINE, *Examiner.*